(12) United States Patent
Lei et al.

(10) Patent No.: US 10,798,854 B2
(45) Date of Patent: Oct. 6, 2020

(54) MODULAR POWER MODULE WITH INTEGRATED COOLANT PASSAGEWAY AND ASSEMBLIES THEREOF

(71) Applicant: Ford Global Technologies, LLC, Dearborn, MI (US)

(72) Inventors: Guangyin Lei, Canton, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/962,365

(22) Filed: Apr. 25, 2018

(65) Prior Publication Data

US 2019/0335628 A1 Oct. 31, 2019

(51) Int. Cl.
*H05K 7/20* (2006.01)
*H01L 23/473* (2006.01)
*H01L 25/11* (2006.01)
*H02M 7/00* (2006.01)

(52) U.S. Cl.
CPC ....... *H05K 7/20927* (2013.01); *H01L 23/473* (2013.01); *H01L 25/112* (2013.01); *H02M 7/003* (2013.01); *H05K 7/20872* (2013.01)

(58) Field of Classification Search
CPC ............ H05K 7/20927; H05K 7/20872; H01L 23/473; F21V 29/30; F21V 29/56; F21V 29/59; H01F 27/10

USPC .................................... 361/677, 679.53, 699
See application file for complete search history.

(56) References Cited

U.S. PATENT DOCUMENTS

| | | | |
|---|---|---|---|
| 6,304,448 B1 | 10/2001 | Fukada et al. | |
| 6,703,261 B2 | 3/2004 | Ito | |
| 7,190,581 B1 | 3/2007 | Hassani et al. | |
| 7,254,034 B2 | 8/2007 | Bolle et al. | |
| 7,817,422 B2 | 10/2010 | Gunturi et al. | |
| 9,173,329 B2 | 10/2015 | Joo et al. | |
| 9,362,598 B2* | 6/2016 | Srinivasan | H01M 10/613 |
| 9,520,305 B2 | 12/2016 | Kulas | |
| 2015/0348869 A1* | 12/2015 | Joshi | H01L 25/07 361/700 |
| 2016/0183409 A1* | 6/2016 | Zhou | H05K 7/20281 361/699 |
| 2016/0309614 A1* | 10/2016 | Kikuchi | H05K 7/2089 |
| 2016/0309624 A1* | 10/2016 | Lei | F28F 9/0246 |
| 2017/0036563 A1* | 2/2017 | Degner | B60L 15/04 |

* cited by examiner

*Primary Examiner* — Jayprakash N Gandhi
*Assistant Examiner* — Stephen S Sul
(74) *Attorney, Agent, or Firm* — David B. Kelley; Brooks Kushman P.C.

(57) ABSTRACT

Power modules of a power module assembly each have a power card including a substrate, signal pins, and power terminals, and a casing over molded on the power card to define a passageway extending between opposite ends of the power module, and a continuous uninterrupted thermal path from the power card to the passageway. The modules are arranged end-to-end to define a continuous fluid pathway via the passageways.

5 Claims, 6 Drawing Sheets

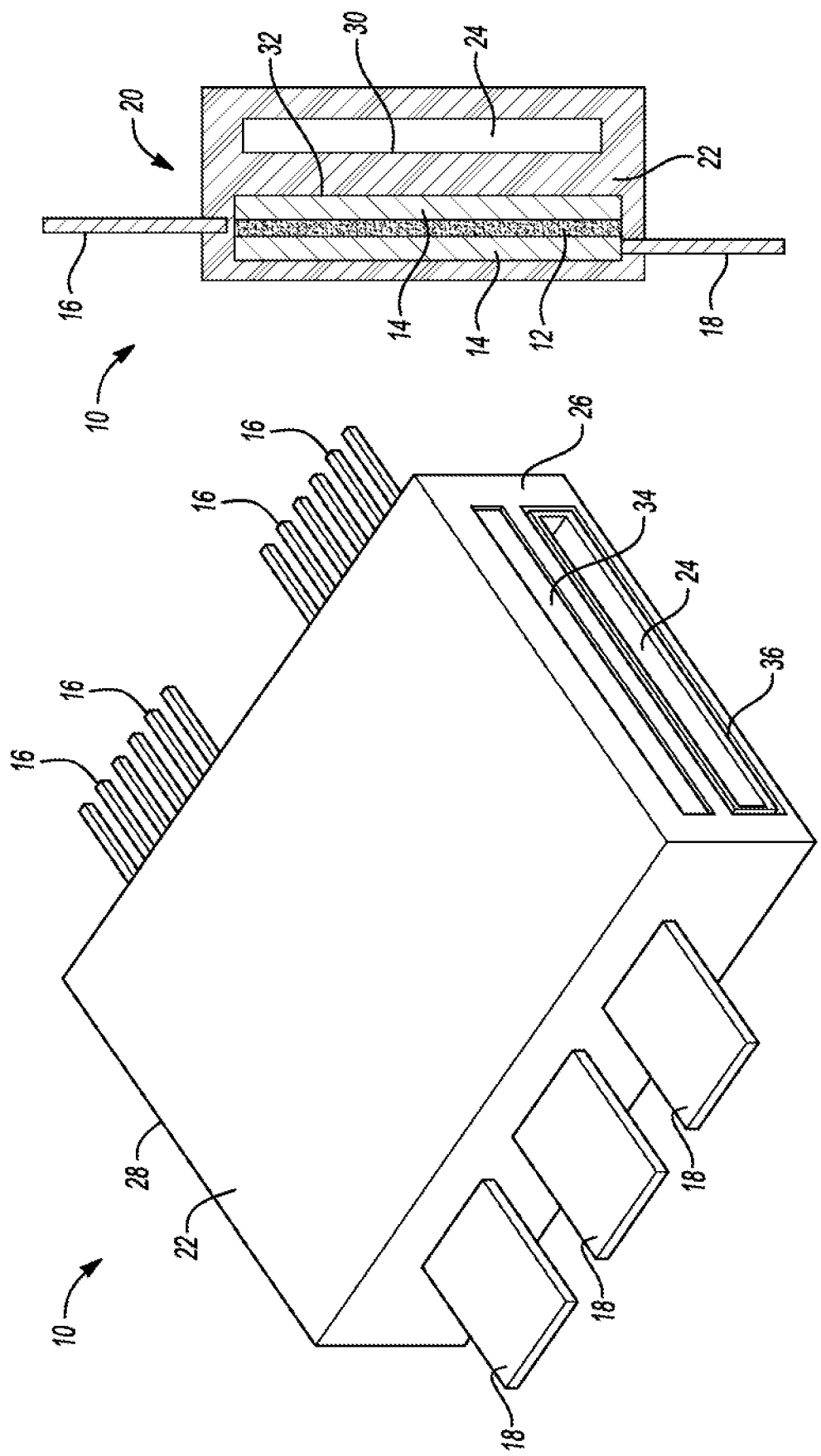

MODULAR POWER MODULE WITH INTEGRATED COOLANT PASSAGEWAY AND ASSEMBLIES THEREOF

TECHNICAL FIELD

This disclosure relates to components of power electronics systems for automotive vehicles.

BACKGROUND

Electrified vehicles such as battery-electric vehicles (BEVs), mild hybrid-electric vehicles (MHEVs), and plug-in hybrid-electric vehicles (PHEVs) typically include energy storage devices such as high voltage (HV) battery systems. These systems include components that facilitate the transfer of electrical power and assist with temperature management.

SUMMARY

A power module assembly includes power modules. The power modules each have a power card including a substrate, signal pins, and power terminals, and a casing over molded on the power card to define a passageway extending between opposite ends of the power module, and a continuous uninterrupted thermal path from the power card to the passageway. The modules are arranged end-to-end to define a continuous fluid pathway via the passageways. The power module assembly may include an end cap disposed against at least one of the power modules and in fluid communication with the continuous fluid pathway. The continuous fluid pathway may form a portion of a U-shaped channel. The power module assembly may further include a pair of end manifolds disposed at opposite ends of and in fluid communication with the continuous fluid pathway. Each of the casings may further define another passageway extending between the opposite ends on a side of the power card opposite the passageway. The modules may be further arranged end-to-end to define another continuous fluid pathway via the another passageways. Each of the opposite ends may define a trough around an opening of the passageway configured to receive a gasket. Some of the opposite ends may define power module locating features. The power modules may be bonded together.

A power module includes a power card including a substrate, metal circuitry thereon, signal pins, and power terminals. The power module also includes a casing over molded on the power card to define a coolant passageway extending between opposite ends of the power module such that the casing provides a continuous uninterrupted thermal path from the power card to the coolant passageway. The casing may further define another coolant passageway extending between the opposite ends on a side of the power card opposite the coolant passageway. The opposite ends may each define a trough around an opening of the coolant passageway configured to receive a gasket. The opposite ends may each define a locating feature configured to mate with another power module.

A power module assembly includes power modules. The power modules each have a power card including a substrate, metal circuitry thereon, signal pins, and power terminals, and a casing over molded on the power card to define a coolant passageway extending between opposite ends of the power module, and to define a continuous uninterrupted thermal path from the power card to the coolant passageway. The power modules are stacked such that coolant passageways are all in parallel. The power module assembly may include a pair of end manifolds disposed at opposite ends of and in fluid communication with each of the coolant passageways. The power modules may be bonded to the end manifolds. Each of the casings may further define another coolant passageway extending between the opposite ends on a side of the power card opposite the coolant passageway. Each of the opposite ends may define a trough around an opening of the coolant passageway configured to receive a gasket. The power modules may be bonded together.

BRIEF DESCRIPTION OF THE DRAWINGS

FIG. 1A is a perspective view of a power module having opposite side signal pins and power terminals, and a single integrated coolant passageway.

FIG. 1B is a side view, in cross-section, of the power module of FIG. 1A.

DETAILED DESCRIPTION

Figure 2B:
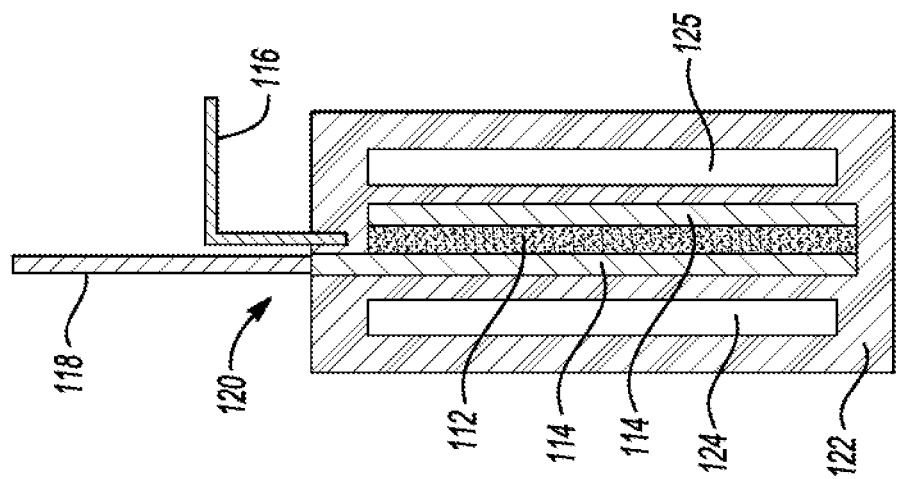
FIG. 2B is a side view, in cross-section of the power module of FIG. 2A.

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

A power module or power electronic module provides physical containment for several power components, usually power semiconductor devices. These power semiconductors (or dies) are typically soldered or sintered on a power electronic substrate that carries the power semiconductors, and provides electrical and thermal contact and electrical insulation where needed. Compared to discrete power semiconductors in plastic housings, power packages provide a higher power density and are in many cases more reliable.

Certain power modules contain a single power electronic switch (e.g., BJT, GTO, IGBT, JFET, MOSFET, etc.) or diode. Other power modules contain multiple semiconductor dies that are connected to form an electrical circuit. Additionally, other components such as ceramic capacitors to minimize switching voltage overshoots and NTC thermistors to monitor substrate temperature may also be included.

Examples of power module topologies include switch (IGBT, MOSFET) with antiparallel diode, bridge rectifier containing four (single phase) or six (three phase) diodes, half bridge (inverter leg with two switches and their corresponding antiparallel diodes), H-Bridge (four switches and their corresponding antiparallel diodes), boost or power factor correction (switches with high frequency rectifying diodes), three level NPC (I-Type) (multilevel inverter leg with four switches and their corresponding antiparallel diodes), three level MNPC (T-Type) (multilevel inverter leg with four switches and their corresponding antiparallel diodes), three-phases inverter (six switches and their corresponding antiparallel diodes), power interface module (input rectifier, power factor correction, and inverter stages), and integrated power module (input rectifier, power factor correction, and inverter stages with their corresponding gate drive circuits).

Power modules are used for power conversion equipment such as AC-DC power supplies, embedded motor drives, industrial motor drives, and uninterruptible power supplies. They are also found in inverters for renewable energy products including electrified vehicles, solar power panels, tidal power plants, and wind turbines.

Here, we concern ourselves with power modules used within the context of electrified vehicles. For certain vehicle power electronics systems—especially traction inverters packaged under-the-hood—high power density and low-profile assembly is highly desired. Achieving some of these objectives, however, can be confounded by the typical stacked power-module-on-cold-plate arrangement. In such arrangements, the power module sits on or under a cold plate to facilitate the transfer of heat therebetween. We in contrast propose to integrate the power module and heat sink into a single modular component to reduce overall component profile: A single integrated component can offer a lower profile as compared to two stacked components. Over molding techniques, for example, can be used to create coolant passageways adjacent to a power module card. And interfaces among these modular components can be sealed by gaskets, O-rings, adhesives, welding, etc. Additional interface features to promote complimentary fit are also contemplated.

With reference to FIGS. 1A and 1B, a power module 10 includes a substrate 12, metal circuitry 14 and the like on the substrate 12, and signal pins 16 and power terminals 18 projecting from opposite sides of the substrate 12. The substrate 12, metal circuitry 14, signal pins 16, and power terminals 18 are thus arranged to form a power card 20. The power module 10 further includes a casing 22 (e.g., epoxy) over molded with the power card 20 and defining a coolant passageway 24 that extends between opposite ends 26, 28 of the power module 10. Here, a major face 30 of the coolant passageway 24 is generally parallel with a major face 32 of the power card 20. This arrangement tends to maximize heat transfer from the power card 20 to coolant passing through the coolant passageway 24. Moreover, because the casing 22 that defines the coolant passageway 24 provides material for a continuous and uninterrupted path to the power card 20, the heat transfer path is improved as compared to arrangements in which a conventional power module is stacked against a cold plate.

The power module 10 may be arranged in groups to form a power module assembly for an inverter, etc. as described in more detail below. To this end, the casing 22 in the example of FIGS. 1A and 1B may include locating features 34 on the ends 26, 28 to assist with interlocking such modular power modules 10. The locating feature 34 on the end 26 in this example is a recessed area. And the locating feature 34 on the end 28 is a complimentary protruding area (not shown). The ends 26, 28 may also define troughs 36 around openings of the coolant passageway 24 to receive O-rings and the like to improve the seal between power modules 10.

Figure 2A:
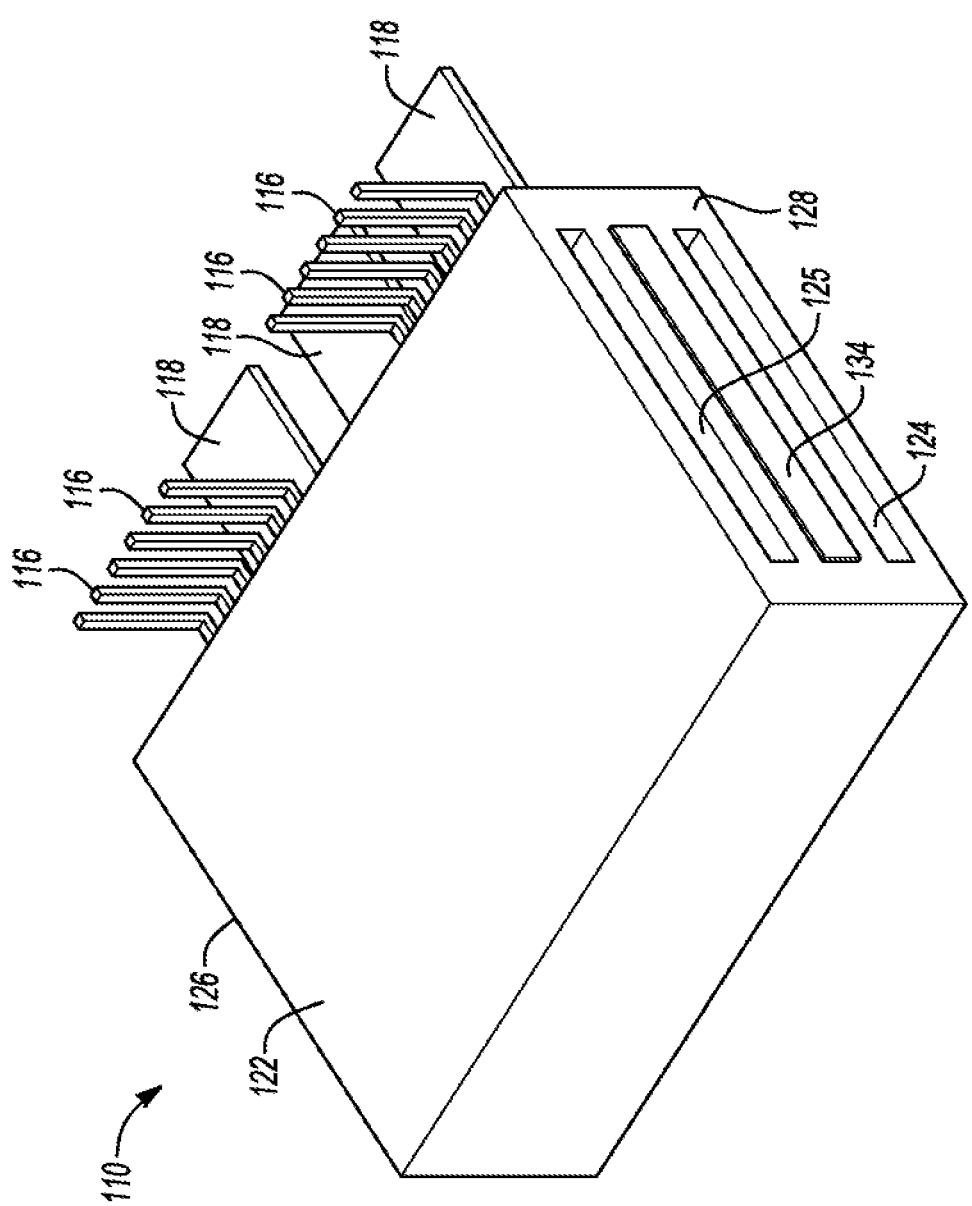
FIG. 2A is a perspective view of a power module having same side signal pins and power terminals, and dual integrated coolant passageways.

With reference to FIGS. 2A and 2B, a power module 110 includes a substrate 112, metal circuitry 114 and the like on the substrate 112, and signal pins 116 and power terminals 118 projecting from a same side of the substrate 112. (Like numbered elements between figures may have similar descriptions.) The substrate 112, metal circuitry 114, signal pins 116, and power terminals 118 are thus arranged to form a power card 120. The power module 110 further includes a casing 122 (e.g., epoxy) over molded with the power card 120 and defining coolant passageways 124, 125 on both sides thereof that extend between opposite ends 126, 128 of the power module 110. Similar to the example of FIGS. 1A and 1B, the layout of the coolant passageways 124, 125 are generally parallel with the power card 120 to maximize heat transfer from the power card 120 to coolant passing through the coolant passageways 124, 125.

The power module 110 may be arranged in groups to form a power module assembly. as described in more detail below. To this end, the casing 122 may include locating features 134 on the ends 126, 128 to assist with interlocking such modular power modules 110. The locating feature 134 on the end 126 is a recessed area (not shown). And the locating feature 134 on the end 128 is a complimentary protruding area. Unlike the example of FIGS. 1A and 1B, the casing 122 does not include troughs around openings of the coolant passageways 124, 126.

Figure 3:
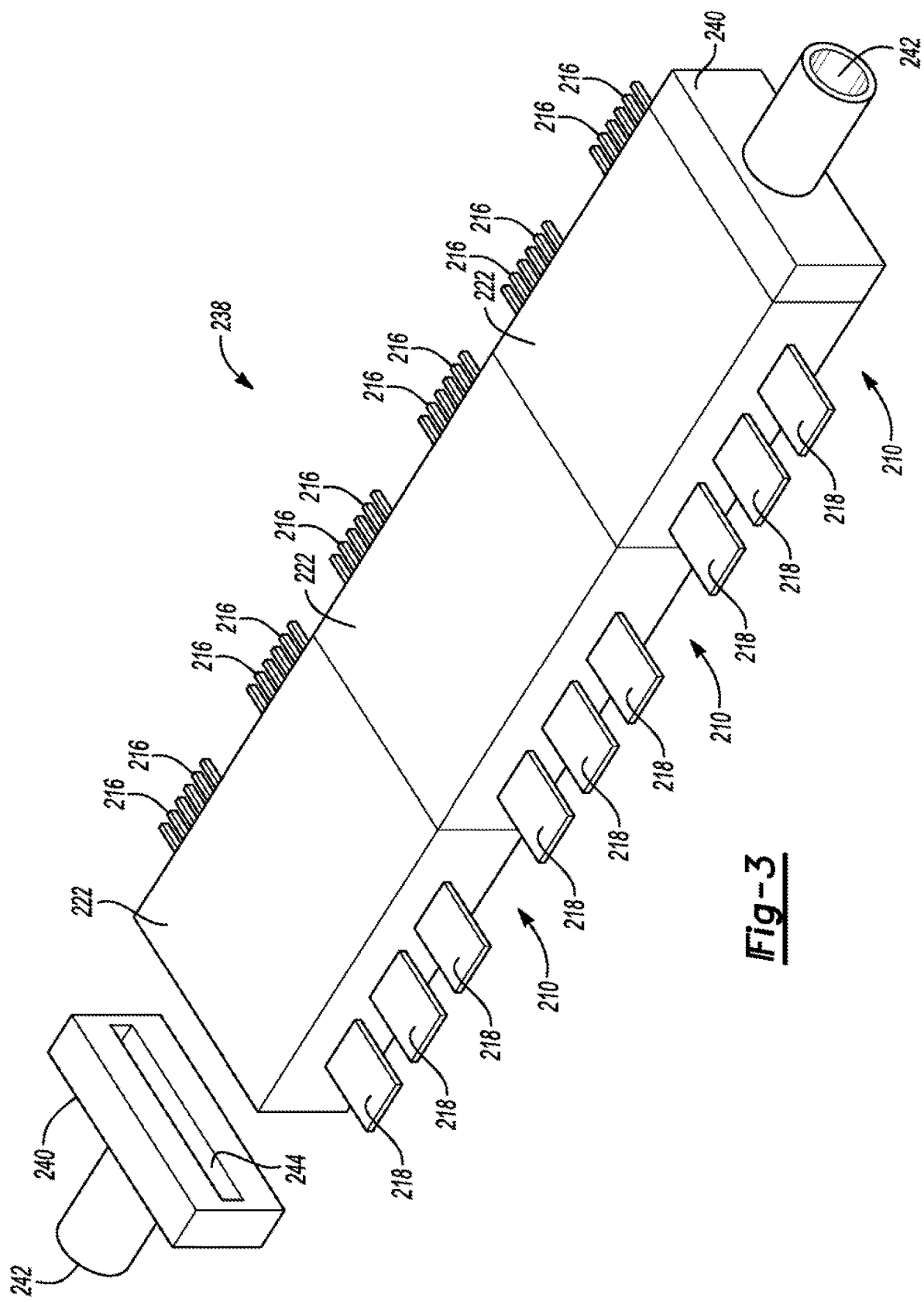
FIG. 3 is a perspective view of an assembly of several power modules similar to that of FIGS. 1A and 1B.

With reference to FIG. 3, a power module assembly 238 includes three power modules 210 and end manifolds 240. Each of the power modules 210 includes among other things signal pins 216, power terminals 218, and a casing 222. The power modules 210 are stacked single file and end-to-end such that coolant passageways (corresponding to the coolant passageway 24 of FIGS. 1A and 1B) thereof are aligned to form a continuous fluid route between the end manifolds 240. In this example, adhesive is used to bond the power modules 210 together.

The end manifolds 240 each include an inlet/outlet 242 and an outlet/inlet 244 (depending on coolant flow direction). The inlet/outlets 242 can be attached with an automotive coolant supply system (not shown) such that coolant can be passed between the end manifolds 240 and through the coolant passageways of the power modules 210.

Figure 4:
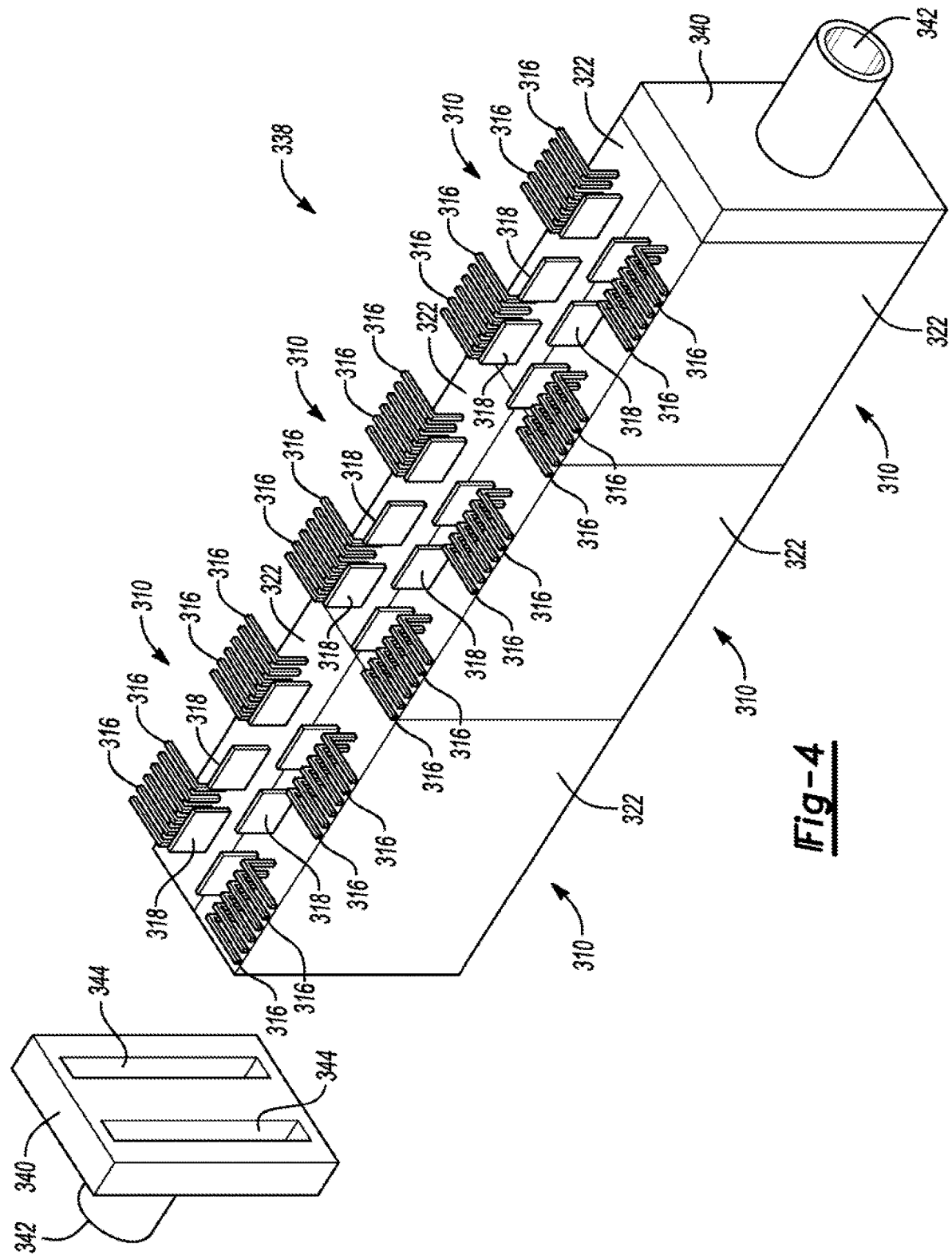
FIG. 4 is a perspective view of an assembly of several power modules similar to that of FIGS. 2A and 2B.

With reference to FIG. 4, a power module assembly 338 includes six power modules 310 and end manifolds 340. Each of the power modules 310 includes among other things signal pins 316, power terminals 318, and a casing 322. The power modules 310 are stacked in two rows of three and end-to-end such that coolant passageways (corresponding to the coolant passageways 124, 125 of FIGS. 2A and 2B) thereof are aligned to form continuous fluid routes between the end manifolds 340. In this example, the end manifolds 340 are arranged to apply a clamping force to the power modules 310.

The end manifolds 340 each include an inlet/outlet 342 and outlet/inlets 344. The inlet/outlets 342 can be attached with an automotive coolant supply system (not shown) such that coolant can be passed between the end manifolds 340 and through the coolant passageways of the power modules 310.

Figure 5:
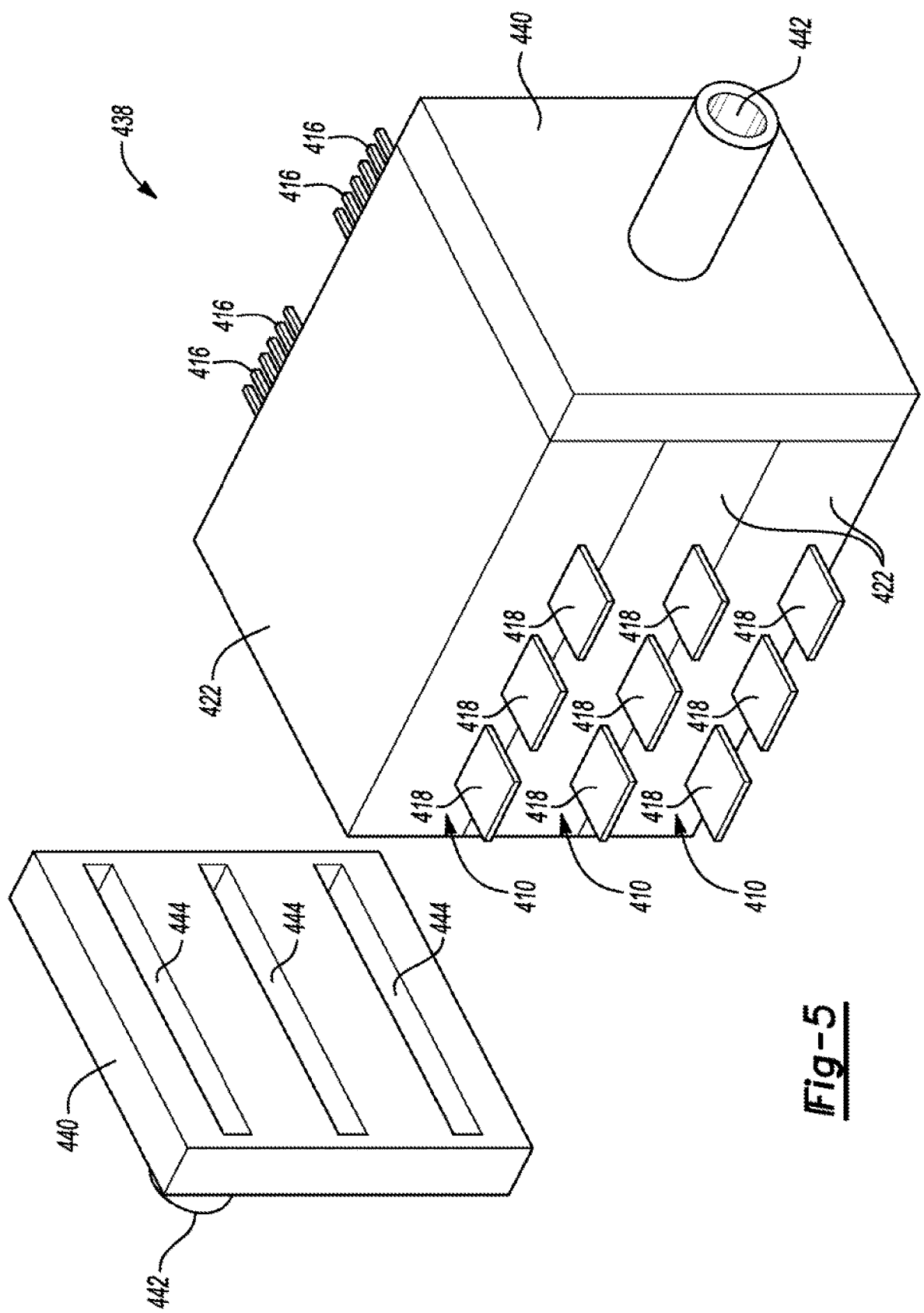
FIG. 5 is a perspective view of another assembly of several power modules similar to that of FIGS. 1A and 1B.

With reference to FIG. 5, a power module assembly 438 includes three power modules 410 and end manifolds 440. Each of the power modules 410 includes among other things signal pins 416, power terminals 418, and a casing 422. The power modules 410 are stacked on top of each other such that coolant passageways (corresponding to the coolant passageways 24 of FIGS. 1A and 1B) thereof are in parallel to each other between the end manifolds 440. In this example, the end manifolds 440 are arranged to apply a clamping force to the power modules 410, and adhesive is used to bond the casing 422 together.

The end manifolds 440 each include an inlet/outlet 442 and outlet/inlets 444. The inlet/outlets 442 can be attached with an automotive coolant supply system (not shown) such that coolant can be passed between the end manifolds 440 and through the coolant passageways of the power modules 410.

Figure 6:
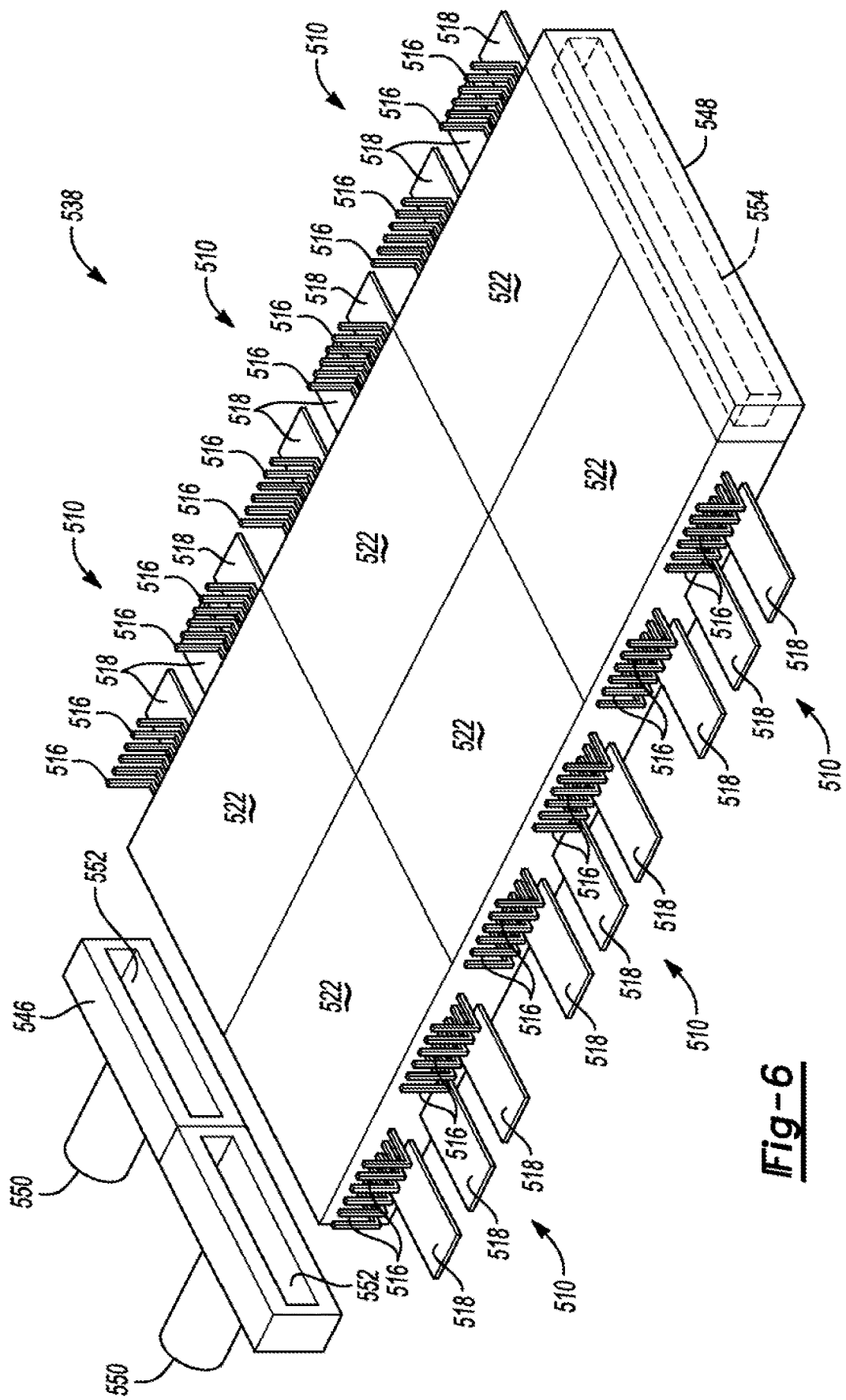
FIG. 6 is a perspective view of another assembly of several power modules similar to that of FIGS. 2A and 2B.

With reference to FIG. 6, a power module assembly 538 includes six power modules 510, end manifold 546, and return cap 548. Here, the end manifold 546 includes inlet/outlets 550 and outlet/inlets 552. And the return cap 548 includes passageway 554.

Each of the power modules 510 includes among other things signal pins 516, power terminals 518, and a casing 522. The power modules 510 are stacked in two single file and end-to-end rows such that coolant passageways (corresponding to the coolant passageway 24 of FIGS. 1A and 1B) thereof are aligned to form a continuous U-shaped fluid route with the passageway 554 between the inlet/outlets 550.

The inlet/outlets 550 can be attached with an automotive coolant supply system (not shown) such that coolant can be passed therebetween and through the U-shaped fluid route defined by the power modules 510 and return cap 548.

The words used in the specification are words of description rather than limitation, and it is understood that various changes may be made without departing from the spirit and scope of the disclosure and claims. Some arrangements, for example, may include different module-to-module locating features such as mating pins and bores, etc., while others may lack them. Coolant passageways need not be rectangular. They may instead by cylindrical or S-shaped as cooling needs dictate. FIGS. 1A and 1B show a single coolant passageway 24. Two or more—on a same or opposite side of the power card 20—may also be used. And although FIGS. 2A and 2B show two coolant passageways 124, 125, a single coolant passageway may suffice. Groups of three and six power modules were illustrated in various configurations. Any number of power modules, however, may be grouped together as desired. Other arrangements are also contemplated.

As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A power module assembly comprising:
power modules each having
   a power card including a substrate, signal pins, and power terminals, and
   a casing over molded on and in direct contact with a major face of the power card, the casing having (i) a passageway extending between opposite ends of the power module and (ii) a continuous uninterrupted thermal path from the major face of the power card to fluid in the passageway in direct contact with a major face of the passageway, the major face of the power card being parallel with the major face of the passageway, and the continuous uninterrupted thermal path being directly between the major face of the power card and the major face of the passageway,
wherein the major face of the power card is one of a pair of largest faces of the power card, wherein the major face of the passageway is one of a pair of largest faces of the passageway, and wherein ends of the power modules are arranged end-to-end to define a continuous pathway via the passageway of each of the power modules for the fluid to flow therethrough in a direction normal to the ends.

2. The power module assembly of claim 1 further comprising a pair of end manifolds disposed at opposite ends of and in fluid communication with the continuous fluid pathway.

3. The power module assembly of claim 1, wherein each of the opposite ends defines a trough around an opening of the passageway.

4. The power module assembly of claim 1, wherein some of the opposite ends define power module locating features.

5. The power module assembly of claim 1, wherein the power modules are bonded together.

* * * * *